United States Patent
Ali et al.

(10) Patent No.: US 7,786,910 B2
(45) Date of Patent: Aug. 31, 2010

(54) CORRELATION-BASED BACKGROUND CALIBRATION OF PIPELINED CONVERTERS WITH REDUCED POWER PENALTY

(75) Inventors: Ahmed Mohamed Abdelatty Ali, Oak Ridge, NC (US); Andrew Stacy Morgan, Stokesdale, NC (US); Scott Gregory Bardsley, Gibsonville, NC (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 12/228,455

(22) Filed: Aug. 12, 2008

(65) Prior Publication Data

US 2010/0039302 A1 Feb. 18, 2010

(51) Int. Cl.
*H03M 1/20* (2006.01)
(52) U.S. Cl. ............... 341/131; 341/118; 341/120; 341/155; 341/161; 341/172
(58) Field of Classification Search ......... 341/118–121, 341/131, 143, 144, 150, 155, 161, 162, 172
See application file for complete search history.

(56) References Cited

U.S. PATENT DOCUMENTS

| | | | | |
|---|---|---|---|---|
| 5,990,815 | A | 11/1999 | Linder et al. | 341/131 |
| 6,172,629 | B1* | 1/2001 | Fetterman | 341/131 |
| 6,369,744 | B1 | 4/2002 | Chuang | 341/161 |
| 6,441,769 | B1 | 8/2002 | Nagaraj | 341/161 |
| 6,462,685 | B1* | 10/2002 | Korkala | 341/131 |
| 6,501,400 | B2 | 12/2002 | Ali | 341/118 |
| 6,686,864 | B1 | 2/2004 | Moreland | 341/161 |
| 6,784,814 | B1* | 8/2004 | Nair et al. | 341/118 |
| 6,822,601 | B1* | 11/2004 | Liu et al. | 341/161 |
| 6,839,009 | B1* | 1/2005 | Ali | 341/118 |
| 6,894,631 | B1* | 5/2005 | Bardsley | 341/120 |
| 7,002,504 | B2* | 2/2006 | McMahill | 341/161 |
| 7,006,028 | B2* | 2/2006 | Galton | 341/155 |
| 7,187,310 | B2* | 3/2007 | El-Sankary et al. | 341/120 |
| 7,233,276 | B1* | 6/2007 | Huang | 341/163 |
| 7,535,391 | B1* | 5/2009 | Newman et al. | 341/131 |

(Continued)

OTHER PUBLICATIONS

E.J. Siragusa, et al., "Gain Error Correction Technique for Pipelined Analogue-to Digital Converters", Electronics Letters, 36, pp. 617-618, Feb. 7, 2000.

(Continued)

*Primary Examiner*—Linh V Nguyen
(74) *Attorney, Agent, or Firm*—Koppel, Patrick, Heybl & Dawson

(57) ABSTRACT

A device and method for correlation-based background calibration of pipelined converters with a reduced power penalty. A pipelined analog-to-digital converter (ADC) utilizes a random or pseudorandom signal to reduce the quantization error of subconverting stages. Stages within the ADC comprise an injection circuit having a plurality of capacitive branches in parallel. Less than all of the branches can function during a given clock cycle of the ADC. This allows a subconverting stage within the ADC to be accurately trimmed before operation using a large amplitude signal. At the same time, the capability to inject smaller amplitude random or pseudorandom signals into the subconverting stage during operation is maintained, saving valuable dynamic range and power. The various capacitive branches are cycled through either randomly or in sequence such that the quantizer manifests the same average gain error over time for which the quantizer was initially trimmed.

38 Claims, 3 Drawing Sheets

U.S. PATENT DOCUMENTS

| | | | | |
|---|---|---|---|---|
| 7,612,703 B2* | 11/2009 | Chen et al. | ............... | 341/172 |
| 2004/0051657 A1* | 3/2004 | Jonsson et al. | ............... | 341/156 |
| 2008/0258949 A1* | 10/2008 | Galton et al. | ............... | 341/120 |

OTHER PUBLICATIONS

S. H. Lewis, et al., "A 10-b 20 M Sample/s Analog-to-Digital Converter", IEEE J. Solid-State Circuits, 27, pp. 351-358, Mar. 1992.

J. Ming and S.H. Lewis, "An 8b 80 M Sample/s Pipelined ADC With Background Calibration", IEEE ISSCC, Oct. 2000, 3 pages.

Ali, A.M.A. et al., "Correction of Operational Amplifier Gain Error in Pipelined ADCs", IEEE International Symposium on—Systems, ISCAS, Oct. 2001, pp. 568-571.

Ali, A.M.A. et al., "Background Calibration of Operational Amplifier Gain Error in Pipelined ADCs", IEEE Transaction on Circuits and systems II, Sep. 2003, pp. 631-634.

H.S. Lee, "A 12-b 600 ks/s Digitally Self-Calibrated Pipelined Algorithmic ADS", IEEE J. Solid-State Circuits, 29, pp. 509-515, Apr. 1994.

PCT Notification of the International Search Report and the Written Opinion of the International Searching Authority, Dated Jan. 28, 2010, For International Application No. PCT/US2009/004547.

Shu, Yun-Shiang et al., "A 15-Bit Linear 20-MS/s Pipelined ADC Digitally Calibrated With Signal-Dependent Dithering", IEEE Journal of Solid State Circuits, vol. 43, No. 2, Feb. 1, 2008, pp. 342-350.

Farahani, Bahar et al., "Low Power High Performance Digitally Assisted Pipelined ADC", IEEE Computer Society Annual Symposium on VLSI, Apr. 7, 2008, pp. 111-116.

Siragusa, Eric et al., A Digitally Enhanced 1.8-V 15-Bit 40-Msample/s CMOS Pipelined ADC, IEEE Journal of Solid State Circuits, vol. 39, No. 12, Dec. 1, 2004, pp. 2126-2138.

* cited by examiner

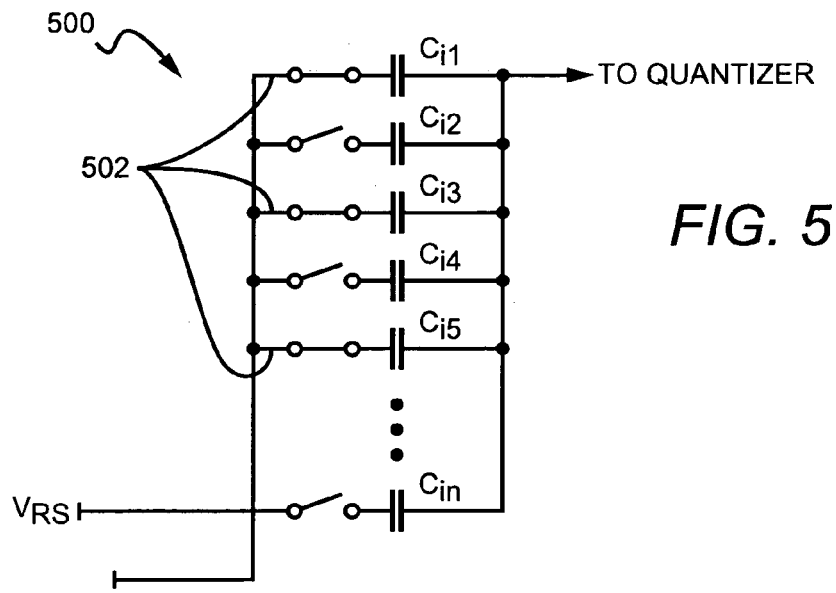
FIG. 5
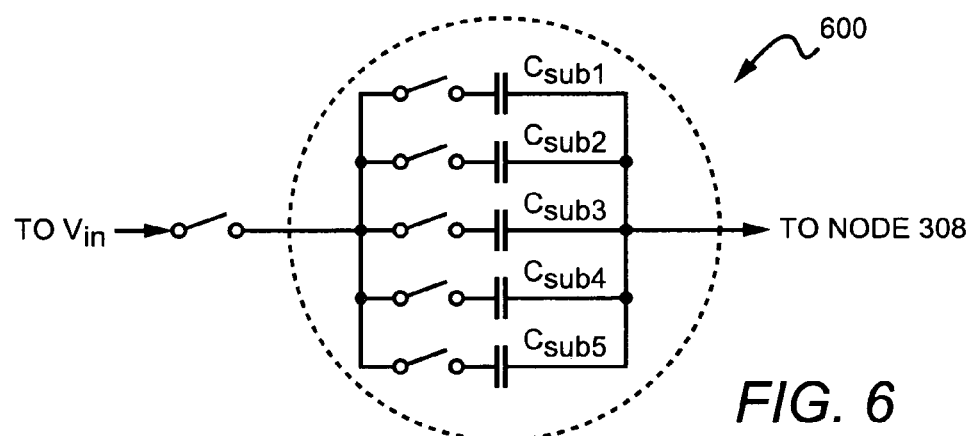
FIG. 6
FIG. 7
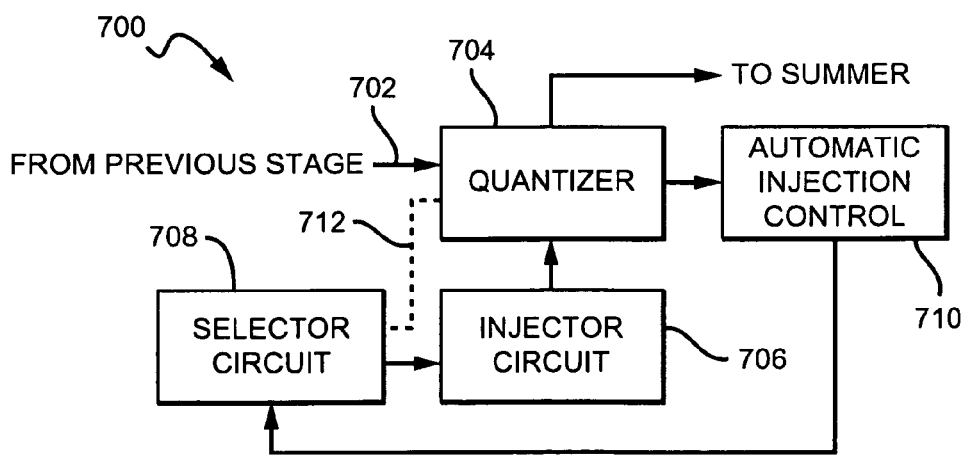

CORRELATION-BASED BACKGROUND CALIBRATION OF PIPELINED CONVERTERS WITH REDUCED POWER PENALTY

BACKGROUND OF THE INVENTION

1. Field of the Invention

The invention relates generally to analog-to-digital converter (ADC) circuits and, more particularly, to calibration of pipelined ADC circuits.

2. Description of the Related Art

Analog-to-digital converters (ADCs) and their counterpart digital-to-analog converters (DACs) are an important class of electrical systems. They are ubiquitous in electrical circuits, having applications ranging from automotive systems to advanced communication systems. Just as the name conveys, ADCs accept a continuous analog signal and convert it to a discrete digital signal. DACs perform the reverse operation. A good ADC recreates an analog signal digitally while maintaining the integrity of the original signal and limiting information loss to an acceptable level.

Several different design approaches have been utilized to realize ADC circuitry, such as flash converters, single- and dual-slope integrating converters, and tracking converters. Each of these designs offers various advantages over the others. Some important characteristics of ADCs include resolution, conversion rate or speed, and step recovery. Resolution is the number of binary bits output by the converter. Speed is a measure of how fast the converter can output a new binary number. In discrete time systems and digital signal processing, bandwidth is associated with the sampling rate, and the term is often used to describe the speed of such a system. Step recovery is a measure of how fast a converter can react in response to a large, sudden jump in the input signal.

One type of ADC, a flash converter, is formed as a series of comparators, each having an associated reference voltage. The input signal is continually compared to the series of increasing reference voltages. For any given input voltage, a corresponding set of comparators will output a signal which is then fed into a priority encoder circuit, producing a binary output. Flash converters usually operate at high speeds (high bandwidth) with good step recovery but have relatively poor resolution.

Single- and dual-slope ADCs use an op-amp circuit configured as an integrator to generate a saw-tooth waveform which serves as the reference signal. The amount of time that it takes the reference signal to exceed the input signal is measured by a precisely clocked digital counter. Integrating converters have good resolution but are generally slower than other designs.

A third type of ADC is the tracking variety. The tracking converter uses a DAC and an up/down counter to generate the digital signal. The counter is continuously clocked and feeds its output into the DAC. The analog output of the DAC is then fed back and compared to the input signal using a comparator. The comparator provides the high/low signal necessary to cause the counter to operate in "count up" or "count down" mode, allowing the counter to track the input signal in discrete steps. Tracking ADCs have acceptable resolution and high bandwidths but suffer from poor step recovery.

Another popular implementation is a multi-tiered architecture called a pipelined ADC. The pipelined ADC uses two or more steps of subconverting. First, a coarse conversion is done yielding the most significant bits (MSBs). Then, a comparison is made between the digital signal and the original analog input. The difference between these two signals, the residue, is then converted at a finer level to get the least significant bits (LSBs). The coarse and fine conversions are then combined using an encoder.

In some ADCs, a dither is used to improve performance. Dither is a relatively small random signal that is added to the input before the conversion is done. Dither is designed to cause the state of the LSB to oscillate between high and low. This allows the system to process lower level signals, rather than simply cutting off the signal at these lower levels. Thus, the range of signals that the ADC can convert is extended at the expense of a small amount of noise. The quantization error resulting from the noise is diffused across many clock cycles, resulting in an accurate representation of the original signal over time.

Several calibration techniques for pipelined ADCs are known in the art. Some of these known techniques correct for errors due to the capacitor mismatch and the operational amplifier finite gain. In some previous techniques, the error was usually dominated by the capacitor mismatch due to relatively low operating speeds. Some of those techniques involved injecting dither in the MDAC that is uncorrelated with the input signal. (See E. J. Siragusa and I. Galton, "Gain error correction technique for pipelined analogue-to-digital converters", Electronics Letters, 36, pp. 540-544, July 1996; J. Ming and S. H. Lewis, "An 8b 80Msample/s pipelined ADC with background calibration", IEEE ISSCC, pp. 42-43, 2000). The dither signal sees the same error as the input signal, and because the dither signal is uncorrelated with the input signal, the dither can be separated digitally by correlating it out. This may be done with a digital correlator (see Siragusa et al.) or using an LMS algorithm (see Ming et al.).

One disadvantage of known dither techniques is that the dither signal consumes a portion of the dynamic range of the system subcomponents, namely the digital-to-analog converter (DAC) that is used within the various stages of the pipelined ADC. Typically, the dither signal is about half the size of the correction range, resulting in a power penalty of about 50% for the DAC where the dither is introduced. (See Siragusa et al.; Ming et al.). This makes the dither calibration technique undesirable for nanometer CMOS processes where dynamic range is a premium commodity.

SUMMARY OF THE INVENTION

One embodiment according to the present invention of a subconverting stage that provides an output signal in response to an input signal comprises a quantizer connected to receive the input signal and a random sequence digital-to-analog converter (RSDAC) connected to inject a random signal into the quantizer. The RSDAC comprises a plurality of capacitive branches arranged in parallel, wherein respective capacitive branches function during clock cycles of the quantizer.

One embodiment according to the present invention of a pipelined analog-to-digital converter (ADC) connected to provide a digital output signal in response to an analog input signal comprises a series of subconverting stages. The stages are connected to digitize respective portions of an input signal. At least one of the subconverting stages comprises a quantizer that is connected to provide a quantized signal in response to a stage input signal. A random sequence generator is connected to generate a random digital signal. A digital-to-analog converter (DAC) is connected to provide a random analog signal to the quantizer in response to the random digital signal. The DAC has a plurality of capacitive branches connected in parallel, wherein the respective capacitive branches function during clock cycles of the quantizer.

One method according to the present invention of calibrating a pipelined ADC that has a series of subconverting stages, at least one of the subconverting stages having a plurality of injection capacitors connected in a parallel combination, comprises trimming the plurality of injection capacitors with a known reference signal. At least one of the injection capacitors is selected to function during a first clock cycle of the subconverting stage. A random signal is injected into the subconverting stage using at least one injection capacitor that has been selected to function. The injection capacitors are cycled through such that at least one of the injection capacitors is selected for operation during subsequent clock cycles.

One embodiment according to the present invention of an ADC that provides a digital output signal in response to an analog input signal comprises a series of subconverting stages arranged in a pipelined configuration. The stages are connected to digitize respective portions of an input signal. An injector circuit is connected to inject a random signal into at least one of the stages. The injector circuit has a plurality of injector capacitors arranged in parallel.

One method according to the present invention for calibrating an ADC circuit having a plurality of injection capacitors for injecting a random signal into the ADC circuit comprises trimming the injection capacitors by introducing a known voltage across the injection capacitors and measuring an output of the ADC circuit. Any output gain error is corrected. The ADC circuit operates such that at least one of the injection capacitors functions during each ADC clock cycle.

Another embodiment according to the present invention of a pipelined ADC connected to provide a digital output signal in response to an analog input signal comprises a series of subconverting stages. The stages are connected to digitize respective portions of an input signal. At least one of the subconverting stages comprises a quantizer connected to receive an input signal and a random sequence digital-to-analog converter (RSDAC) that is connected to inject a random signal into the quantizer. The RSDAC comprises a plurality of injection capacitors arranged in parallel, wherein respective injection capacitors function during clock cycles of the quantizer.

BRIEF DESCRIPTION OF THE DRAWINGS

FIG. 5 is a circuit schematic of another embodiment of an injection circuit according to the present invention.

FIG. 6 is a circuit schematic representing an embodiment of a signal capacitor in an embodiment of an ADC sub-circuit.

FIG. 7 is a block diagram representing an ADC subconverting stage according to an embodiment of the present invention.

DETAILED DESCRIPTION OF THE INVENTION

Figure 1:
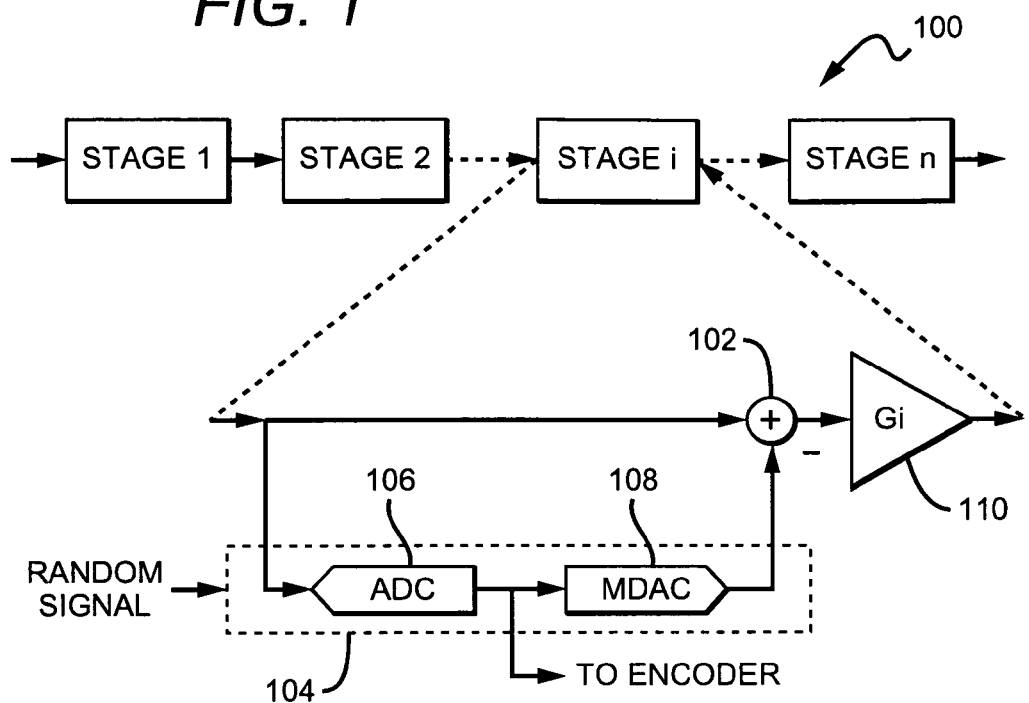
FIG. 1 is a block diagram of an embodiment of a pipelined ADC according to the present invention, featuring a enlarged view of a portion of a subconverting stage.

The present invention provides a novel ADC design with elements that allow for efficient dynamic calibration. The present invention also provides novel methods for calibrating an ADC. The new design and methods work particularly well with pipelined ADCs. Pipelined ADCs are a popular implementation that employs multiple subconverting stages to digitize an analog signal, piece by piece. A coarse conversion is performed on the input signal in the first stages with finer conversion done in the subsequent stages. The converted signals are recombined to yield an accurate digital representation of the original analog signal. Digital signals are easily manipulated and processed and allow for interfacing of real-world analog signals to digital systems.

In pipelined ADC architectures, the various subconverting stages must be tightly calibrated to prevent an error, such as an inter-stage gain error, from propagating through subsequent stages. Because of multiple high gain stages, even a small error can be magnified to unmanageable levels in the latter stages of the system. One known method that is used to calibrate inter-stage gain error is to introduce a random or pseudorandom signal (referred to as dither in some contexts). For purposes of this description, a random signal may also comprise a pseudorandom signal though not explicitly stated. Embodiments of the present invention use the random signal to calibrate the individual subconverting stages as discussed in more detail below. There is a drawback to injecting a random signal into the system; some of the system power and dynamic range must be used to accommodate the extra signal, reducing the power and dynamic range that is available for converting the input signal.

The present invention as embodied in the claims allows for the injection of a small random signal into the quantizer without sacrificing the accuracy of the output signal after the random signal is correlated out. Initially, in one embodiment, it is necessary to calibrate the system by trimming the capacitors. The calibration should be very accurate so that small injection capacitors may be used to inject a small random signal during operation, conserving dynamic range and power and reducing error. In order to calibrate the system accurately, a large uncorrelated random signal should be injected which, because the reference signal remains constant, requires a large capacitance. If the system is calibrated accurately, the random signal is known sufficiently such that it is possible to precisely subtract out the injected random signal during normal system operation even though small injection capacitors are used. Embodiments of the present invention use a combination of smaller capacitive elements to collectively inject a larger random signal during calibration. Then during normal operation a subset of the capacitors operates during a given clock cycle, improving the performance of the system.

In one embodiment, an injection circuit comprises multiple capacitive branches arranged in a parallel configuration. These capacitive branches can include capacitive networks comprising many different devices, or each branch may include a single injection capacitor. The injection capacitors can be much smaller than the capacitors used in elements of the quantizer (e.g., the signal capacitors used in the DAC element). The parallel configuration allows all of the injection capacitors to be trimmed as a single large capacitance. As stated above, this is desirable because it is easier to accurately trim a large capacitance using a larger signal.

However, when the system is operating, less than all of the capacitive branches function during a single clock cycle. Depending on the random signal amplitude that is needed, the system may operate a single capacitive branch or a subset of the capacitive branches. After a clock cycle is completed, another capacitive branch or combination of capacitive branches is selected for the next clock cycle. Injecting the random signal with less than all of the capacitive branches reduces its amplitude, saves power and conserves dynamic range needed for the input signal. Because the capacitive branches are cycled during operation, the errors associated with the individual capacitive branches average out to closely approximate the error figure for all of the capacitive branches in combination. Thus, the average error figure over time closely matches the error figure for which the circuit has already been trimmed.

The algorithm can operate on de-correlating the input and random signal using the LMS algorithm, for example:

$$Ge_{n+1} = Ge_n - \mu * Vd * [Vd * Ge_n - V_S]$$

where Ge is the estimated gain, Vd is the ideal dither (random signal), Vs is the signal (input+dither), and µ is the algorithm step size.

In another embodiment, multiple sub-capacitors may be used to build the larger signal capacitors in the DAC element (or the flash in other embodiments). The signal sub-capacitors should be the same size as the unit injection capacitors. In the same way that the injection capacitors are cycled during operation, the signal sub-capacitors may also by cycled to reduce the error associated with mismatch of the signal capacitors. In such an embodiment, the factory calibration of the signal capacitors may be eliminated as the capacitor mismatch error will average out over several operational cycles.

FIG. 1 illustrates one embodiment of a pipelined ADC according to the present invention. The operation and basic structure of pipelined ADCs are known in the art and, therefore, only briefly discussed herein. Pipelined ADC 100 has multiple subconverting stages (STAGES 1-$n$). Although the stages appear in a linear configuration, pipelined ADCs typically have a tiered architecture. STAGE i represents an intermediate stage, a portion of which is shown expanded for ease of reference in FIG. 1.

An analog input signal is introduced at subconverting STAGE 1. The input signal propagates through the ADC 100 with different portions of the signal being digitized at each of the stages. An analog signal representing a portion of the original signal is introduced at STAGE i. At this point the subconverting stage input signal is input to two elements. The stage input signal is fed into a quantizing circuit 104 which outputs a quantized version of the signal which is then input to a summer 102. The stage input signal also feeds into the summer 102 for comparison with the output of the quantizing circuit 104.

The quantizing circuit 104 can have several different configurations. One embodiment of a quantizing circuit is shown in FIG. 1 as comprising an ADC 106 and an MDAC 108. The second part of the subconverting stage input signal is introduced to the ADC 106 which converts the signal into a digital version. This digital signal represents a portion of the original analog input signal and is sent to an encoder as the most significant bit information for that stage. The MDAC 108 converts the digital signal back to quantized analog form so that it can be subtracted out at summer 102. Summer 102 receives the stage input signal and an inverted version of the quantized signal. Thus, the summer 102 subtracts the quantized signal from the stage input signal, yielding a residue signal. The residue signal is gained up at amplifier 110 and passed on to subsequent stages for finer conversion.

A random signal is injected into the quantizing circuit 104. As discussed above, the random signal provides noise which has the effect of randomizing quantization error and preventing repeating error patterns that can cause harmonic distortion.

Figure 2:
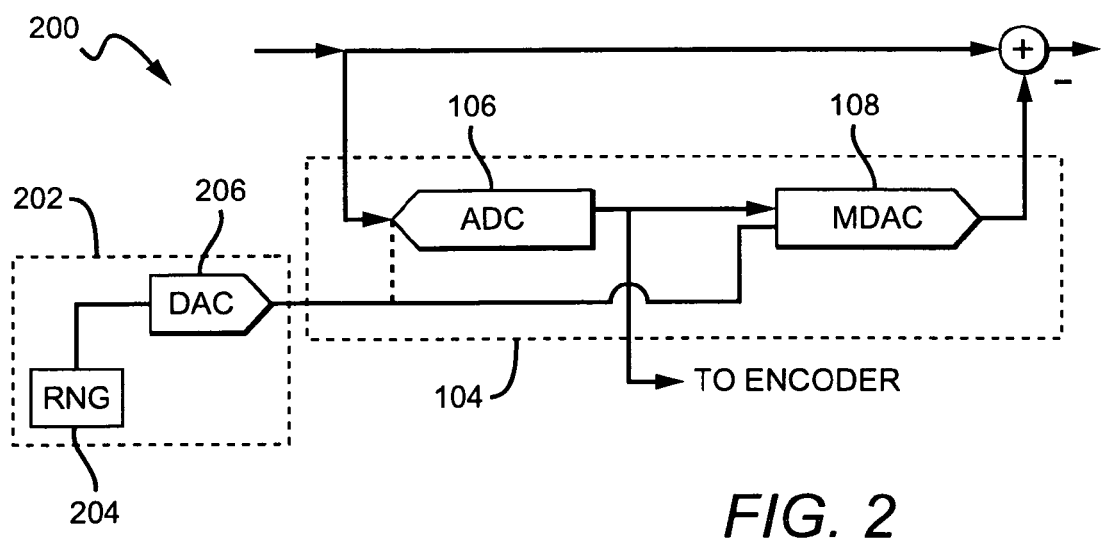
FIG. 2 is a schematic diagram showing alternate embodiments of an ADC sub-circuit according to the present invention.

FIG. 2 shows alternate embodiments of a sub-circuit 200 of the ADC 100 according to the present invention. The random signal may be introduced into the quantizing circuit 104 either at the MDAC 108 or the ADC 106 (as shown by the hashed connection). The random signal is supplied by an injector circuit 202. One embodiment of the injector circuit 202 comprises the combination of a random number generator (RNG) 204 and a DAC 206. In another embodiment, a pseudorandom number generator (PRNG) may be substituted for the RNG 204.

Figure 3:
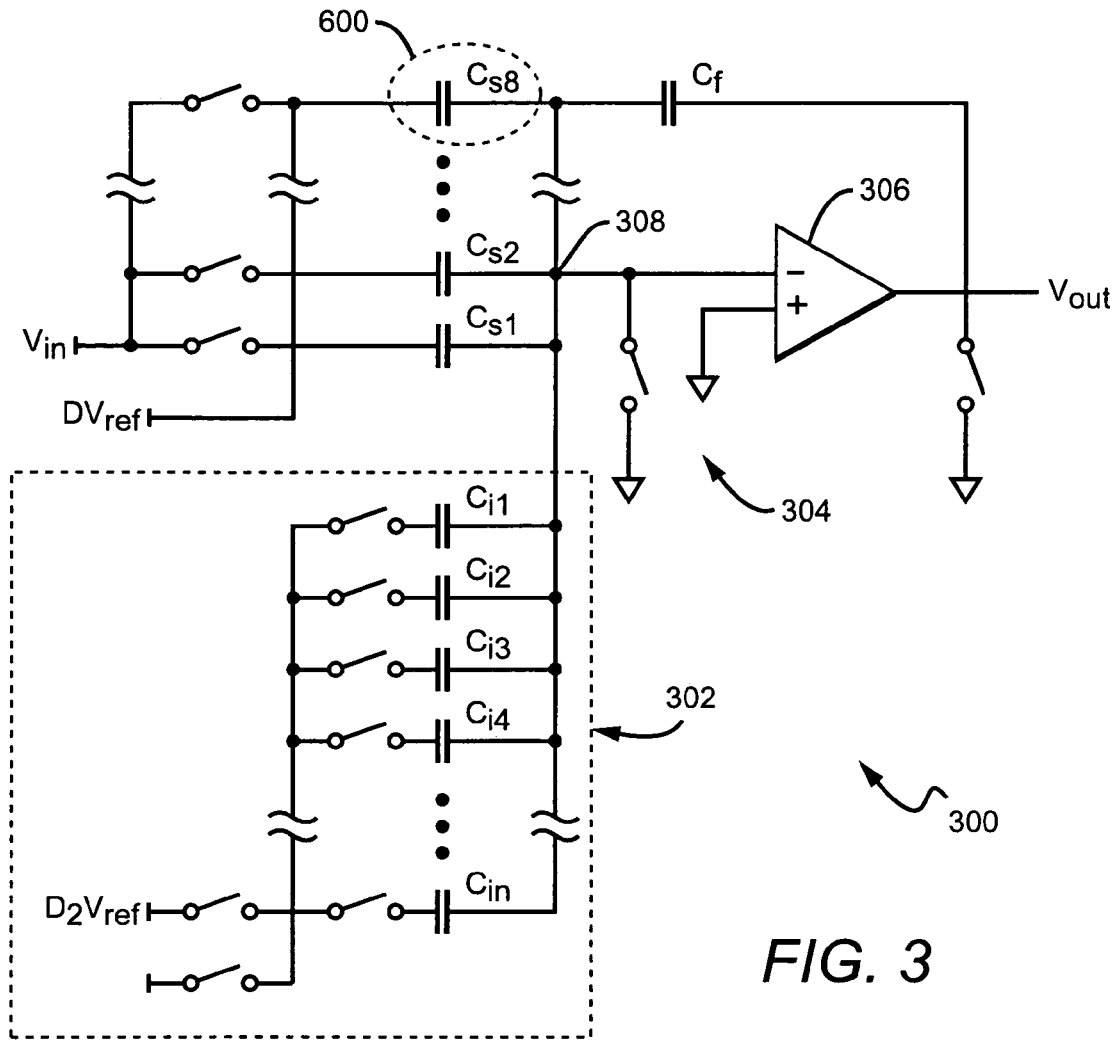
FIG. 3 is circuit schematic of an embodiment of an ADC sub-circuit according to the present invention.

FIG. 3 shows an embodiment of a sub-circuit 300 of the ADC 100 according to the present invention. In this particular embodiment the injector circuit 302 is connected to the MDAC 304 of the quantizing element 104 all of which is not shown in FIG. 3. The MDAC 304 comprises a plurality of signal capacitors $C_{S1}$-$C_{S8}$. This embodiment has eight signal capacitors; thus, it is capable of 3-bit conversion. More or fewer signal capacitors can be used in the MDAC 304 depending on the number of bits the stage is required to convert. Each signal capacitor has an associated switch that closes to connect the capacitor to an input signal. The feedback capacitor $C_f$ can be adjusted to change the gain of the MDAC 304. The amplifier 306 amplifies the signal at node 308 and outputs a quantized analog signal $V_{out}$. $V_{out}$ is fed into the summer 102 (shown in FIG. 2). The input signal $V_{in}$ comes from the output of the ADC element 106 of the quantizing circuit 104.

This particular embodiment operates with two phases: an input phase and a gain phase. During the input phase, $V_{in}$ charges the various signal capacitors using known methods and circuitry. A digital reference voltage $DV_{ref}$ from the ADC element 106 of the quantizing circuit 104 determines whether each signal capacitor charges to a high value or a low value. During the gain phase, the amplifier 306 amplifies the signal at node 308. This includes the signals from the signal capacitors and the random signal from the injector circuit 302.

In this embodiment the injector circuit 302 contains a number n of injection capacitors $C_{i1}$-$C_{in}$. The injection capacitors are arranged in parallel between the random signal input $D_2V_{ref}$ and node 308. Although each parallel branch of the injection circuit 302 shows a single injection capacitor, it may be desirable to include a more complex capacitive network in each branch to achieve a specific capacitance. Each branch has an associated switch that can be closed during the gain phase to activate a particular branch.

The injection capacitors $C_{i1}$-$C_{in}$ can be the same size or different sizes. Furthermore, the injection capacitors can be much smaller than the signal capacitors (e.g., 1/20 or 1/10 the size of the signal capacitors). During the initial calibration of the injection circuit 302, for example the factory calibration, the entire block of injection capacitors can be trimmed as a single capacitive unit. This allows the manufacturer to use a larger reference voltage to match the capacitances in the MDAC 304 and determine the gain error of the amplifier 306. Once the gain error is known, correctional measures may be applied at the output of the amplifier 306 to adjust the output to the expected level. For example, a digital correction coefficient can be used or hardware can be added for an analog correction. Using a larger capacitance makes trimming the injection capacitors a much easier task, because the adjustments do not have to be as sensitive as they would if a smaller capacitance is used.

Although a large reference voltage is advantageous during the trimming process, a much smaller injected random signal is desirable during operation. This is because the random signal consumes valuable dynamic range and power that are needed for the input signal. In fine geometry processes, such as nanometer CMOS, as the supply voltage drops dynamic range and power are scarce resources that cannot be spent on the random signal. In order to keep the amplitude of the random signal down to an acceptable level, small injection capacitors are used.

Unlike the trimming process where all of the injection capacitors function at the same time as a single capacitive unit to accommodate a large reference voltage, during operation less than all of the injection capacitors function during a single clock cycle (i.e., one input phase and one gain phase). In some cases, only a single injection capacitor will be needed to discharge the entire random signal into the quantizing circuit 104 or, more specifically, the MDAC 304 in this embodiment. In other cases, a subgroup of injection capacitors will function during a clock cycle. A selector circuit (not shown in FIG. 3) rotates through all of the injection capacitors over a number of clock cycles so that the trimming corrections done for the entire capacitive unit remain accurate over time as discussed in detail below. Thus, the parallel configuration of injection capacitors allows for accurate trimming without the dynamic range and power penalties normally associated with large random signals.

The injection capacitors can be all the same size or different sizes. The capacitors can be sized such that various combinations yield a desired range of capacitances. Because each injection capacitor has an associated switch, any combination can easily be selected for operation during a given clock cycle.

Figure 4:
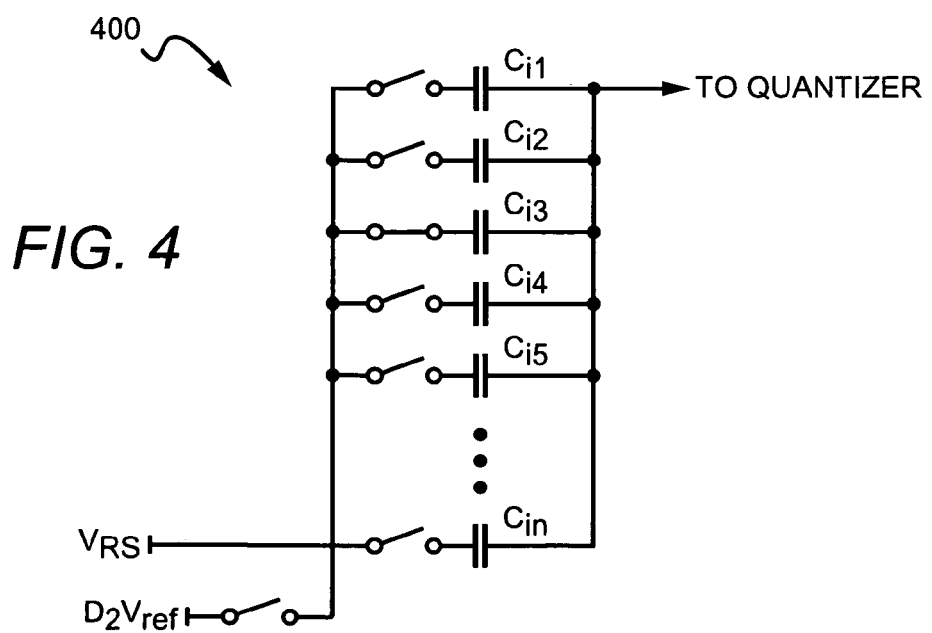
FIG. 4 is a circuit schematic of an injection circuit according to one embodiment of the present invention.

FIG. 4 illustrates an injection circuit 400 according to one embodiment of the present invention. A random signal $D_2V_{ref}$ is applied at the input of the injection circuit 400. Because $D_2V_{ref}$ is random it may be injected during both phases of operation. If $D_2V_{ref}$ is fixed, then it can be injected during only one of the phases of operation. The random signal can be generated using known methods such as a random number generator combined with a DAC, for example. A pseudorandom signal can also be used in which case a pseudorandom number generator is used. A reference voltage $V_{ref}$ is also applied at the input. The injector circuit 400 can comprise any number of injection capacitors which can be arranged with a single capacitor in each parallel branch or with a more complex capacitive network in each branch. In this particular embodiment the injection circuit 400 comprises a number n of injection capacitors $C_{i1}$-$C_{in}$ with one capacitor in each branch. Each branch is connected to the quantizer 104 through a switch.

The injection circuit 400 is shown in an operational mode. During the gain phase of the clock cycle shown, only one branch of the injection circuit is connected to the quantizing circuit 104. The switch connected to $C_{i3}$ is shown closed, indicating that the random signal is being injected into the quantizing circuit 104 through injection capacitor $C_{i3}$. $C_{i3}$ may have been selected for operation during this particular clock cycle randomly, or it may have been selected according to a sequence.

If the injection capacitors are chosen randomly, the average gain error over several clock cycles will approximately equal the aggregate gain error of all the injection capacitors for which the quantizing circuit 104 was trimmed. However, if the order of operation of the capacitors is chosen according to a pre-set sequence, an algorithm should be employed to ensure that the capacitors operate such that the same average error is manifested over time. It may also be desirable to use a dynamic sequence that changes based on some criteria related to the output of the quantizing circuit 104. If a dynamic sequence is used, it may be necessary to use a more sophisticated monitoring algorithm to ensure the correct average gain error over time.

FIG. 5 shows another embodiment of an injection circuit 500 according to the present invention. As discussed above the injection capacitors may function singly or in combination as subgroups. During this particular exemplary clock cycle, three different branches of the injection circuit 500 are transmitting $D_2V_{ref}$ to the quantizer 104. The switches associated with $C_{i1}$, $C_{i3}$ and $C_{i5}$ are closed, indicating that these branches are operating as a subgroup 502. The capacitive values for the branches containing $C_{i1}$, $C_{i3}$ and $C_{i5}$ may be the same, or they may have different values. The total subgroup capacitance during a given clock cycle is the sum of the capacitance of each branch operating during that cycle, in this case:

$$C_{total} = C_{i1} + C_{i3} + C_{i5}.$$

A larger total injection circuit capacitance can accommodate a larger random signal. Thus, the branches can be assigned different capacitive values so that a selectable range of random signal amplitudes can be injected into the quantizer 104.

FIG. 6 is a schematic view of one of the signal capacitors in an embodiment of a sub-circuit of an ADC similar to the sub-circuit 300. The signal capacitor $C_{S8}$ from sub-circuit 300 has been magnified to show additional details of another embodiment featuring multiple sub-capacitors $C_{sub1}$-$C_{sub5}$. However, $C_{S8}$ was only chosen as an example; any or all of the signal capacitors $C_{S1}$-$C_{S8}$ may comprise the sub-capacitor structure in various embodiments. With reference to sub-circuit 300 of FIG. 3, in the same way that the injection capacitors $C_{i1}$-$C_{in}$ are cycled during operation, the signal sub-capacitors $C_{sub1}$-$C_{sub5}$ may also by cycled to reduce the error associated with mismatch of the signal capacitors $C_{s1}$-$C_{s8}$. In such an embodiment, the factory calibration of the signal capacitors $C_{S1}$-$C_{S8}$ may be eliminated as the capacitor mismatch error will average out over several operational cycles.

The sub-capacitors $C_{sub1}$-$C_{sub5}$ should be sized to match the unit size of the injection capacitors $C_{i1}$-$C_{in}$. For example, in the embodiment shown in FIG. 3 the injection capacitors $C_{i1}$-$C_{in}$ may be sized at 10 fF, and the signal capacitors $C_{s1}$-$C_{s8}$ may be sized at 50 fF. In this case, the signal capacitors $C_{s1}$-$C_{s8}$ may comprise 5 sub-capacitors $C_{sub1}$-$C_{sub5}$ arranged in parallel, each sized at 10 fF (i.e., 5×10 fF∥=50 fF). This is only meant as an exemplary configuration. Many other combinations are possible to achieve various signal capacitor values.

FIG. 7 is a block diagram representing a subconverting stage 700 of the ADC 100 according to an embodiment of the present invention. This particular stage 700 is an intermediate stage. An input signal 702 from the output of a previous stage is applied to the quantizer 704. The quantizer 704 and the injector circuit 706 operate as described herein with the injector circuit 706 comprising a plurality of capacitive branches. A selector circuit 708 is connected to select which of the capacitive branches will function during a given clock cycle. An automatic injection control circuit 710 monitors the output of the quantizer 704 and is connected to control the selector circuit 708.

As described above with reference to FIGS. 4 and 5, the selector circuit 708 may select a single capacitive branch for operation or a subgroup of capacitive branches. The injection capacitor(s) is selected depending on a desired amplitude for the injected random signal. If a large random signal is needed, the selector circuit 708 activates a branch or combination of branches that will provide a total capacitance large enough to accommodate the signal. The selector circuit 708 cycles through the capacitors or subgroups such that the gain error of the quantizer 704 averages out to the expected value over time as described above. The selector circuit 708 can select the capacitors randomly or according to a pre-set or dynamic sequence.

The automatic injection control circuit 710 is connected to monitor the output of the quantizer 704. Information relating to this output is fed back to the selector circuit 708. This configuration allows the stage 700 to vary the amplitude of the injected random signal in response to changes in the amplitude of the stage input signal 702, ensuring that the entire dynamic range of the quantizer 704 is utilized regardless of the input signal 702 amplitude.

For example, if the output signal of the quantizer 704 is relatively large, the automatic injection control circuit 710 feeds this information to the selector circuit 708. The selector circuit 708 then selects which of the injection capacitors will function so that an appropriately sized random signal will be injected into the quantizer. Generally, if the output signal of the quantizer 704 is large, the injected random signal must be small so that the sum of these signals remains within the dynamic range budget. Likewise, if the output from the quantizer 704 becomes smaller, the automatic injection control circuit 710 sends the information to the selector circuit 708, and the injected random signal is increased in amplitude to utilize the extra dynamic range that is available. Thus, using this scheme the amplitude of the injected random or pseudorandom signal is negatively related to the amplitude of the quantizer output.

In embodiments similar to that shown in FIG. 6, a selector circuit 708 is connected to the quantizer 704 (shown by the dashed connection 712) to select which of the sub-capacitors $C_{sub1}$-$C_{sub5}$ will be functioning during a given clock cycle. As discussed above, this selection is performed similar to the selection of the injection capacitors $C_{i1}$-$C_{in}$. The selection may be random, pseudorandom or ordered. The selector circuit may be the same circuit that operates on the injection capacitors $C_{i1}$-$C_{in}$ as shown in FIG. 6, or it may be a different circuit.

Although the present invention has been described in detail with reference to certain preferred configurations thereof, other versions are possible. Therefore, the spirit and scope of the invention should not be limited to the versions described above.

We claim:

1. An analog-to-digital converter (ADC) subconverting stage that provides an output signal in response to an input signal, comprising:
   a quantizer connected to receive an input signal, said quantizer comprising:
      an analog-to-digital converter (ADC) connected to produce a digitized signal in response to said input signal; and
      a multiplying digital-to-analog converter (MDAC) connected to produce said output signal as a quantized signal in response to said digitized signal; and
   a random sequence digital-to-analog converter (RSDAC) connected to inject a random signal into said quantizer, said RSDAC comprising a plurality of capacitive branches arranged in parallel;
   wherein respective capacitive branches function during clock cycles of said quantizer.

2. The ADC subconverting stage of claim 1, wherein only one of said capacitive branches functions during a single clock cycle of said quantizer.

3. The ADC subconverting stage of claim 1, wherein a subgroup of said capacitive branches functions during a single clock cycle of said quantizer.

4. The ADC subconverting stage of claim 1, wherein at least two of said capacitive branches have different capacitive values.

5. The ADC subconverting stage of claim 1, further comprising a selector circuit connected to select at least one of said capacitive branches to function during each clock cycle of said quantizer.

6. The ADC subconverting stage of claim 5, wherein said selector circuit randomly selects said at least one capacitive branch to function during each clock cycle.

7. The ADC subconverting stage of claim 5, wherein said selector circuit sequentially selects said capacitive branches from cycle to cycle.

8. The ADC subconverting stage of claim 5, further comprising an automatic injection control circuit connected to control said selector circuit such that said at least one capacitive branch is selected according to criteria related to the amplitude of said output signal.

9. The ADC subconverting stage of claim 8, wherein said automatic injection control circuit selects said at least one capacitive branch to function such that the amplitude of said random signal that is injected into said quantizer is negatively related to the amplitude of said quantizer output signal.

10. The ADC subconverting stage of claim 1, wherein said ADC is a flash ADC.

11. The ADC subconverting stage of claim 1, wherein said RSDAC is connected to inject said random signal into said ADC.

12. The ADC subconverting stage of claim 1, wherein said RSDAC is connected to inject said random signal into said MDAC.

13. The ADC subconverting stage of claim 1, said MDAC comprising a plurality of signal capacitive branches connected in parallel.

14. The ADC subconverting stage of claim 13, said signal capacitive branches comprising multiple sub-capacitors arranged in parallel, wherein respective sub-capacitors function during clock cycles of said quantizer.

15. The ADC subconverting stage of claim 1, wherein said random sequence comprises a pseudorandom sequence.

16. The ADC subconverting stage of claim 1, wherein each of said capacitive branches comprises an injection capacitor.

17. The ADC subconverting stage of claim 1, wherein each of said capacitive branches comprises a capacitive network.

18. A pipelined analog-to-digital converter (ADC) connected to provide a digital output signal in response to an analog input signal, comprising:
   a series of subconverting stages, said stages connected to digitize respective portions of an input signal, at least one of said subconverting stages comprising:
      a quantizer connected to provide a quantized signal in response to a stage input signal;
      a summer connected to subtract said quantized signal from said stage input signal and to output a residue signal;
      a random sequence generator connected to generate a random digital signal;
      a digital-to-analog converter (DAC) connected to provide a random analog signal to said quantizer in response to said random digital signal, said DAC having a plurality of capacitive branches connected in parallel;
      wherein respective capacitive branches function during clock cycles of said quantizer;
   a selector circuit connected to select at least one of said capacitive branches to function during each clock cycle; and an automatic injection control circuit connected to control said selector circuit such that said at least one capacitive branch is selected according to criteria related to the amplitude of said quantized signal.

19. The pipelined ADC of claim 18, wherein only one of said capacitive branches functions during a single clock cycle.

20. The pipelined ADC of claim 18, wherein a subgroup of said capacitive branches functions during a single clock cycle.

21. The pipelined ADC of claim 18, wherein at least two of said capacitive branches have different capacitive values.

22. The pipelined ADC of claim 18, wherein said selector circuit randomly selects said at least one capacitive branch.

23. The pipelined ADC of claim 18, wherein said selector circuit sequentially selects said capacitive branches from cycle to cycle.

24. The pipelined ADC of claim 18, wherein said automatic injection control circuit selects said at least one capacitive branch to function such that the amplitude of said random signal that is injected into said quantizer is negatively related to the amplitude of said quantized signal.

25. The pipelined ADC of claim 18, wherein said quantizer comprises:
   an analog-to-digital converter (ADC) connected to produce a digitized signal in response to said input signal;
   a multiplying digital-to-analog converter (MDAC) connected to produce said output signal as a quantized signal in response to said digitized signal.

26. The pipelined ADC of claim 25, wherein said ADC is a flash ADC.

27. The pipelined ADC of claim 25, wherein said DAC is connected to inject said random signal into said ADC.

28. The pipelined ADC of claim 25, wherein said DAC is connected to inject said random signal into said MDAC.

29. The pipelined ADC of claim 25, said MDAC comprising a plurality of signal capacitive branches connected in parallel.

30. The pipelined ADC of claim 29, said signal capacitive branches comprising multiple sub-capacitors arranged in parallel, wherein respective sub-capacitors function during clock cycles of said quantizer.

31. The pipelined ADC of claim 18, wherein said random signal comprises a pseudorandom signal.

32. The pipelined ADC of claim 18, wherein each of said capacitive branches comprises an injection capacitor.

33. The pipelined ADC of claim 18, wherein each of said capacitive branches comprises a capacitive network.

34. A method of calibrating a pipelined ADC that has a series of subconverting stages, at least of one of said subconverting stages having a plurality of injection capacitors connected in a parallel combination, comprising:
   trimming said plurality of injection capacitors with a known reference signal;
   selecting at least one of said injection capacitors to function during a first clock cycle of said subconverting stage;
   injecting a random signal into said subconverting stage using said at least one injection capacitor that has been selected to function; and
   cycling through said injection capacitors such that at least one of said injection capacitors is selected for operation during subsequent clock cycles.

35. The method of claim 34, wherein said injection capacitors are cycled in a random sequence.

36. The method of claim 34, wherein said injection capacitors are cycled in an ordered sequence.

37. The method of claim 34, further comprising:
   dynamically adjusting the random signal amplitude such that said random signal amplitude is maximized for a given subconverting stage output amplitude and a given dynamic range.

38. A method for calibrating an analog-to-digital converter (ADC) circuit having a plurality of injection capacitors for injecting a random signal into said ADC circuit, comprising:
   trimming said injection capacitors by introducing a known voltage across said injection capacitors and measuring an output of said ADC circuit;
   correcting for any output gain error; and
   operating said ADC circuit such that at least one of said injection capacitors functions during each ADC clock cycle.

* * * * *